US010719111B2

(12) United States Patent
Hung et al.

(10) Patent No.: US 10,719,111 B2
(45) Date of Patent: Jul. 21, 2020

(54) MULTIPORT CONNECTOR AND POWER CONTROL METHOD

(71) Applicant: ASUSTeK COMPUTER INC., Taipei (TW)

(72) Inventors: Yu Hung, Taipei (TW); Yu-Cheng Shen, Taipei (TW); Tzu-Nan Cheng, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 230 days.

(21) Appl. No.: 15/875,435

(22) Filed: Jan. 19, 2018

(65) Prior Publication Data

US 2018/0224911 A1 Aug. 9, 2018

(30) Foreign Application Priority Data

Feb. 8, 2017 (TW) .............................. 106104170 A

(51) Int. Cl.
| | |
|---|---|
| *G06F 1/26* | (2006.01) |
| *H01R 13/6473* | (2011.01) |
| *H01R 31/06* | (2006.01) |
| *H01M 10/44* | (2006.01) |
| *H05K 1/02* | (2006.01) |
| *H01R 31/02* | (2006.01) |
| *H02J 7/00* | (2006.01) |

(52) U.S. Cl.
CPC ................ *G06F 1/26* (2013.01); *G06F 1/266* (2013.01); *H01M 10/44* (2013.01); *H01R 13/6473* (2013.01); *H01R 31/02* (2013.01); *H01R 31/06* (2013.01); *H02J 7/00* (2013.01); *H05K 1/025* (2013.01)

(58) Field of Classification Search
CPC ........... G06F 1/266; G06F 1/26; H01R 31/02; H01R 31/06; H01R 13/6473; H05K 1/025; H01M 10/44; H02J 7/0052
See application file for complete search history.

(56) References Cited

U.S. PATENT DOCUMENTS

| | | | |
|---|---|---|---|
| 2008/0303486 A1* | 12/2008 | Kao | ...................... H02J 7/0021 320/139 |
| 2012/0235630 A1* | 9/2012 | Qiu | ......................... H02J 7/022 320/107 |
| 2016/0277335 A1* | 9/2016 | Cheung | ................... H04L 51/12 |
| 2017/0154000 A1* | 6/2017 | Garibay | .............. G06F 13/4022 |

FOREIGN PATENT DOCUMENTS

| | | |
|---|---|---|
| CN | 104868509 A | 8/2015 |
| CN | 204650373 U | 9/2015 |

* cited by examiner

*Primary Examiner* — Alfonso Perez Borroto
*Assistant Examiner* — Esayas G Yeshaw
(74) *Attorney, Agent, or Firm* — McClure, Qualey & Rodack, LLP.

(57) ABSTRACT

A multiport connector and a power control method are provided. The multiport connector comprises a power output port and multiple power input ports. The power output port is connected to an electronic device. The power input ports are connected to multiple power adapters to form multiple power transmission paths. Each power transmission path comprises a power line, a detecting circuit and an impedance component connected to the detecting circuit in series. Therefore, when the electronic device is connected to the multiport connector, the electronic device detects the equivalent impedance formed by the impedance components on the detecting circuits to adjust an upper limit of load power.

13 Claims, 9 Drawing Sheets

MULTIPORT CONNECTOR AND POWER CONTROL METHOD

CROSS-REFERENCE TO RELATED APPLICATION

This application claims the priority benefit of TW application serial No. 106104170, filed on Feb. 8, 2017. The entirety of the above-mentioned patent application is hereby incorporated by references herein and made a part of specification.

BACKGROUND OF THE INVENTION

Field of the Invention

The disclosure relates to a power control device and, more specifically, to a multiport connector and a power control method.

Description of the Related Art

Electronic devices such as a notebook computer, are usually charged by connecting to a power adapter. However, when the operation efficiency of an electronic device increased, the power consumption also increased, thus only one power adapter is insufficient.

BRIEF SUMMARY OF THE INVENTION

According to an aspect of the disclosure, a multiport connector configured to be connected to multiple power adapters is provided. The multiport connector comprises: a power output port, configured to be connected to an electronic device; and multiple power input ports configured to be connected to the power adapters to form multiple power transmission path, each of the power transmission paths includes a power line, a detecting circuit, and an impedance component connected to the detecting circuit in series.

According to an aspect of the disclosure, a power control method is provided. The method comprises: providing multiple power transmission paths connected to a same power receiving port, each of the power transmission paths includes an impedance component; detecting equivalent impedance of the impedance components; and adjusting an upper limit of load power according to the equivalent impedance.

In embodiments, the number of the power adapters connected to an electronic device is detected to adjust the upper limit of load power of the electronic device. Then, the number of power adapters are varied to meet the requirement on the efficiency of the electronic device.

DETAILED DESCRIPTION OF THE EMBODIMENTS

These and other features, aspects, and advantages of the present invention will become better understood with regard to the following description, appended claims, and accompanying drawings. However, the invention is not limited to the embodiments.

Figure 1:
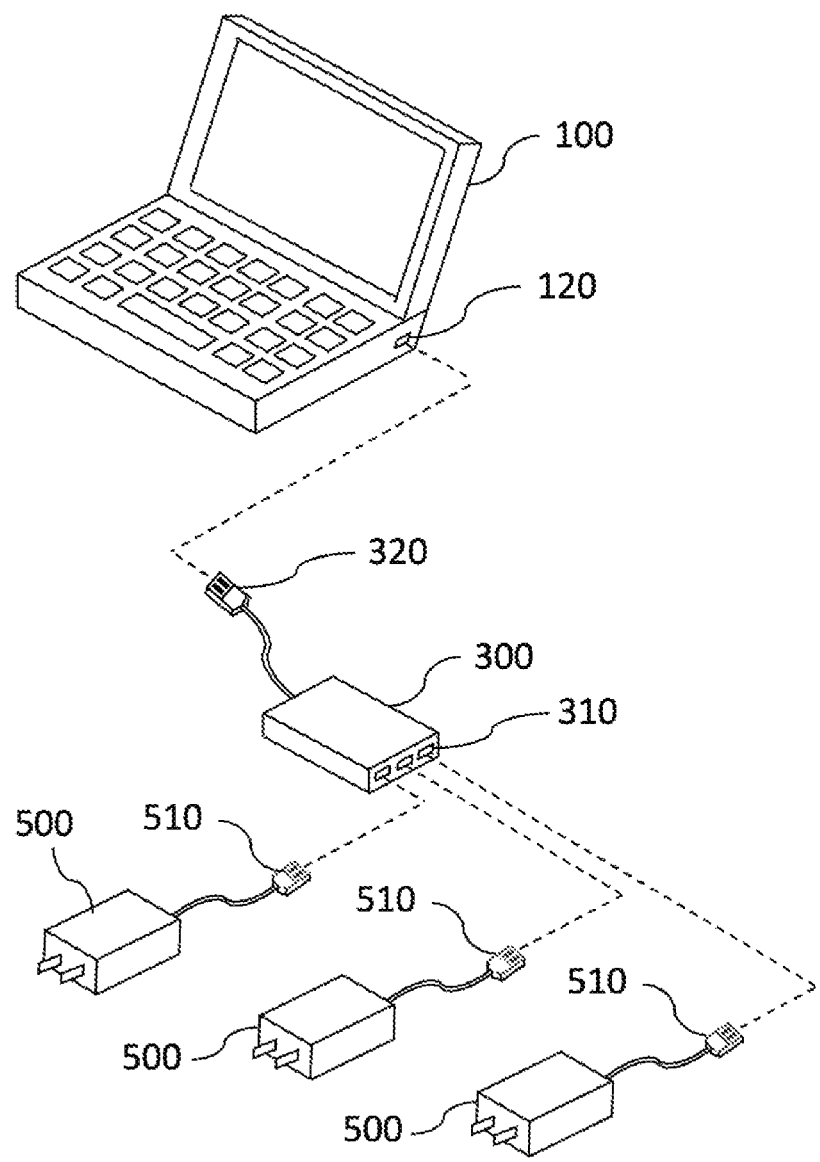
FIG. 1 is a schematic diagram showing a connection of a multiport connector according to a first embodiment.
Figure 2:
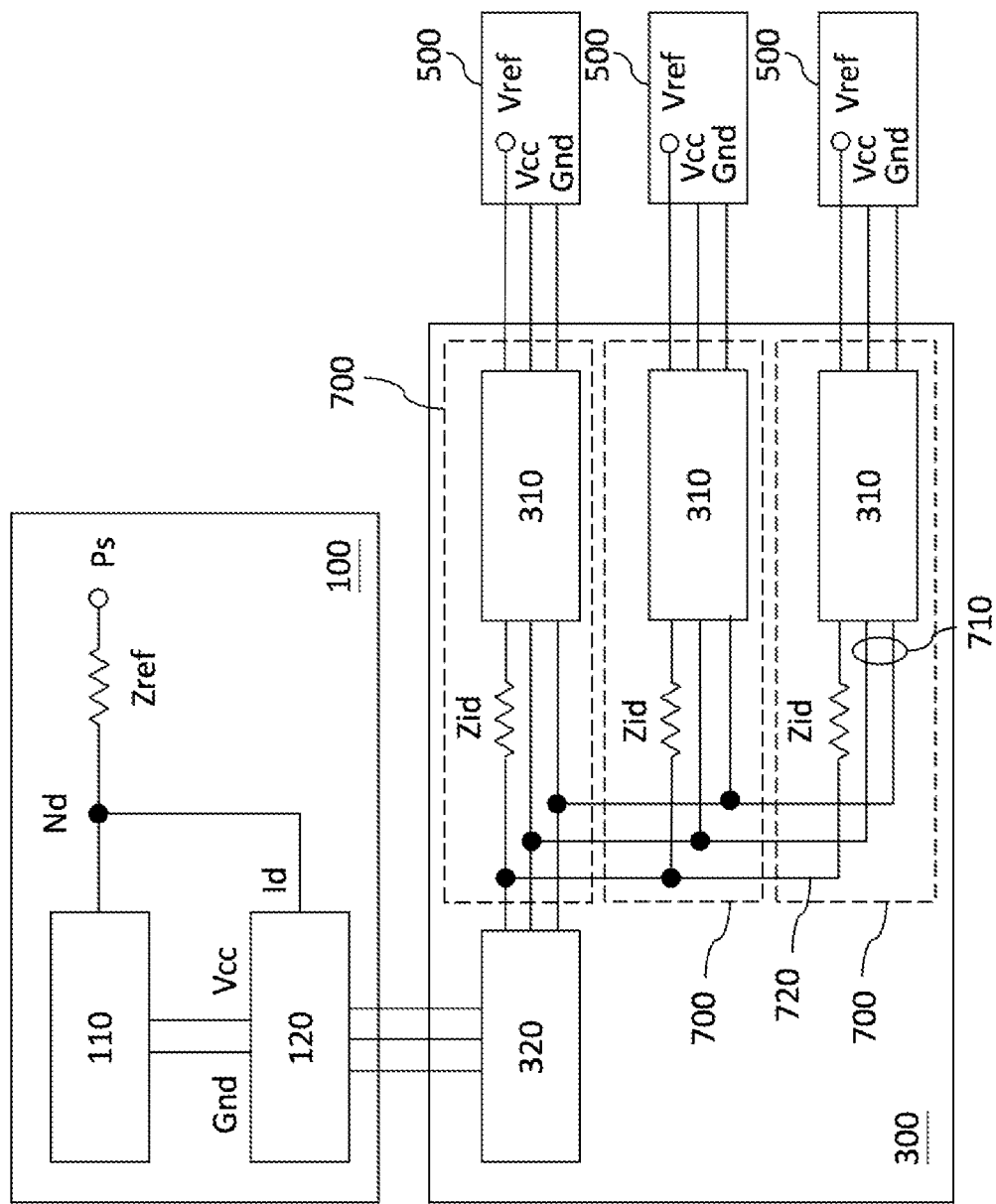
FIG. 2 is a block diagram of a multiport connector according to a first embodiment.

Please refer to FIG. 1 and FIG. 2. FIG. 1 is a schematic diagram showing a connection of a multiport connector according to a first embodiment. FIG. 2 is a block diagram of a multiport connector according to a first embodiment. A multiport connector 300 is configured to be connected to an electronic device 100 and multiple power adapters 500. The multiport connector 300 includes multiple power input ports 310 and a power output port 320. The electronic device 100 includes a power control unit 110 and a power receiving port 120. The power receiving port 120 is connected to the power control unit 110. The power input ports 310 of the multiport connector 300 are connected to the power adapter 500, respectively, to form multiple power transmission paths 700. Each power transmission path 700 includes a power line 710, a detecting circuit 720 and an impedance component Zid connected to the detecting circuit 720 in series. Each power transmission path 700 is connected to the power control unit 110 via the power receiving port 120. The power control unit 110 distributes the received power to every components in the electronic device 100. The power control unit 110 detects the equivalent impedance of the impedance components Zid of the detecting circuits 720 to adjust an upper limit of load power. In an embodiment, the power control unit 110 is a power control circuit or an integrated power control chip.

In an embodiment, three power input ports 310 are configured herein. However, the number of the power input ports is varied according to requirements, which is not limited herein. In an embodiment, as showed in FIG. 1 and FIG. 7, the electronic device 100 is a notebook computer. When the electronic device 100 needs power from the power adapter 500, a connection terminal 510 of the power adapter 500 is connected to the power receiving port 120 of the electronic device 100. Therefore, when the power adapter 500 is connected to main power, the power adapter 500 converts the main power to the power for the electronic device 100. The power is transmitted to the electronic device 100 via the connection terminal 510. When the operation efficiency of the electronic device 100 needs to be increased, more power adapters 500 are available to connected to the electronic device 100 to provide more power. The power output port 320 of the multiport connector 300 is connected to the power receiving port 120 of the electronic device 100. Furthermore, according to the number of the power adapters 500, the power adapters 500 are connected to multiple power input ports 310 of the multiport connector 300 correspondingly. Therefore, the electronic device 100 receives the power from the power adapters 500 that connected to the multiport connector 300.

Please refer to FIG. 2, the power line 710 includes two traces, a voltage level Vcc and a ground level Gnd. In another embodiment, the power line 710 includes more traces to transmit different voltage levels. The impedance component Zid is one or a combination of a resistor, a capacitor, and an inductor. In the embodiment, the impedance component Zid is a resistor.

In the embodiment, the impedance component Zid is configured in the multiport connector 300. Multiple power input ports 310 are configured as the input ports of the power transmission path 700. The power input ports 310 are correspondingly connected to the power adapter 500 to receive the power from the power adapter 500. The output ports of the power transmission path 700 are converged to the power output port 320. The power output port 320 of the multiport connector 300 is connected to the power receiving port 120 of the electronic device 100. Then, each power transmission path 700 is connected to the power control unit 110 to transmit the power to the power control unit 110. In other words, two traces of each power line 710 are correspondingly connected and converged to the power output port 320. The impedance component Zid is connected between the power input port 310 and the power output port 320. When the power input port 310 is connected to the power adapter 500, the corresponding impedance component Zid is connected to a first reference voltage Vref of the power adapter 500. Then, the first reference voltage Vref is equal to the ground level Gnd of the power line 710. In another embodiment, the first reference voltage Vref has different voltage value other than the ground level Gnd of the power line 710, which is not limited herein.

Figure 3:
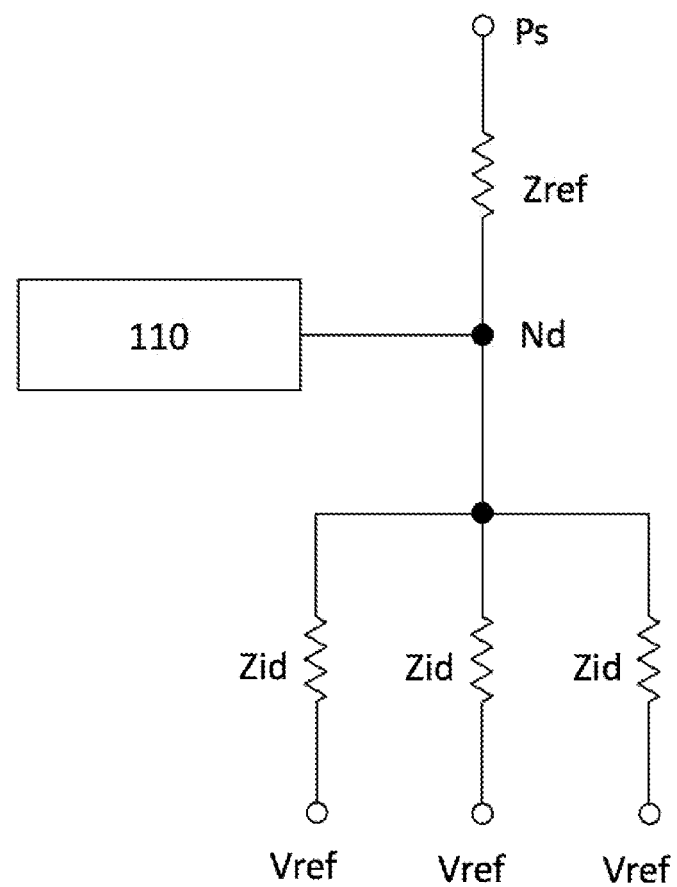
FIG. 3 is an equivalent circuit diagram of a detecting circuit according to a first embodiment.

As shown in FIG. 2, the electronic device 100 further includes a first reference impedor Zref connected to the power receiving port 120. The power control unit 110 is connected to a node Nd between the first reference impedor Zref and the power receiving port 120. The first reference impedor Zref is one or a combination of a resistor, a capacitor, an inductor, which is not limited herein. In the embodiment, the first reference impedor Zref is a resistor. Please refer to FIG. 2 and FIG. 3, FIG. 3 is an equivalent circuit diagram of a detecting circuit according to a first embodiment. When the multiport connector 300 is connected to the power receiving port 120, the impedance component Zid of the power transmission path 700 is connected to the first reference impedor Zref of the electronic device 100. In the embodiment, the first reference impedor Zref is connected to the impedance component Zid in series. One end of the first reference impedor Zref away from the node Nd is connected to a reference power source Ps. In the embodiment, the reference power source Ps is a voltage source. When the impedance component Zid is not connected to the power adapter 500, the power input port 310 is open-circuit, the impedance component Zid does not appear in the equivalent circuit. Therefore, after the power control unit 110 detects that the node voltage between the first reference impedor Zref and the impedance component Zid is connected to the power adapter 50, the equivalent impedance of the impedance components Zid on the detecting circuits 720 is calculated according to the voltage dividing theory. Then, the number of the impedance components Zid connected to the power adapter 500 is determined. As a result, an upper limit of load power is adjusted. For example, the resistance of the first reference impedor Zref is 50 k ohms, the resistance of the impedance component Zid is 100 k ohms, the voltage of the reference power source Ps is 20 volts. When three power adapters 500 are connected (the first reference impedor Zref is connected to three impedance components Zid in series, and the three impedance components Zid are connected in parallel), the voltage value detected by the power control unit 110 is 8 volts. When two power adapters 500 are connected (the first reference impedor Zref is connected to two impedance components Zid in series, and the two impedance components Zid are connected in parallel), the voltage value detected by the power control unit 110 is 10 volts. When one power adapters 500 is connected (the first reference impedor Zref is connected to one impedance component Zid in series), the voltage value detected by the power control unit 110 is 13.3 volts. Moreover, when the power adapter 500 is connected to the power receiving port 120 of the electronic device 100 via the connection terminal 510, the voltage value detected by the power control unit 110 is 0 volt. Therefore, the power control unit 110 determines the number of the power adapters 500 connected to the multiport connector 300 according to the detected voltage value. When more power adapters 500 are connected, the load power is adjusted to be higher correspondingly.

Figure 4:
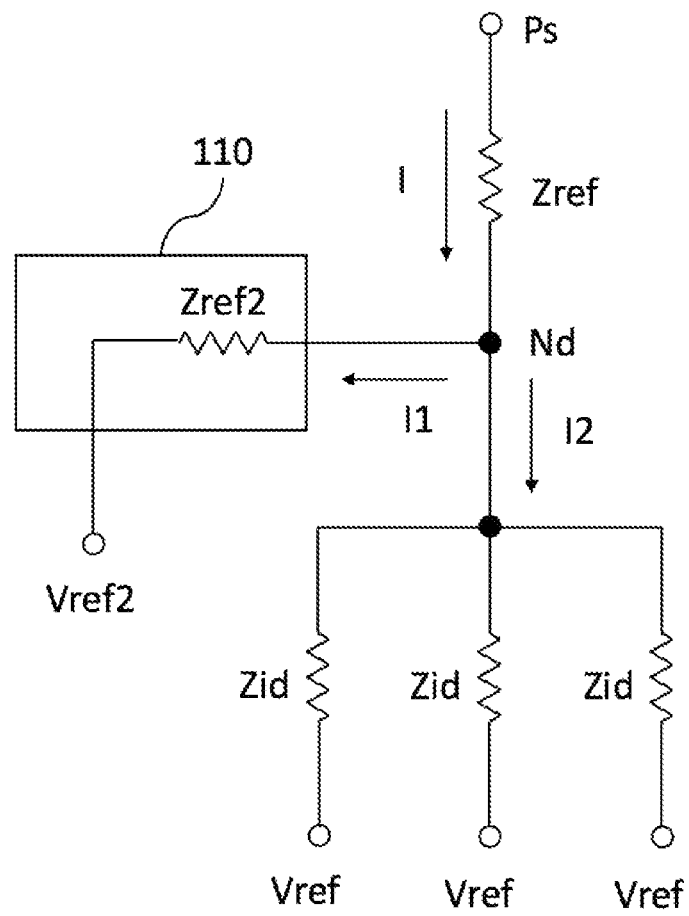
FIG. 4 is an equivalent circuit diagram of a detecting circuit according to a first embodiment.

In another embodiment, the reference power source Ps is a current source. In the embodiment, the power control unit 110 detects the current value through the impedance component Zid and calculates the equivalent impedance of the impedance component Zid. Please refer to FIG. 4. FIG. 4 is an equivalent circuit diagram of a detecting circuit according to a first embodiment. As shown in FIG. 4, the electronic device 100 further includes a second reference impedor Zref2. One end of the second reference impedor Zref2 is connected to the node Nd (between the first reference impedor Zref and the impedance component Zid). The other end of the second reference impedor Zref2 receives a second reference voltage Vref2. Therefore, the current I through the first reference impedor Zref is shunted to a first current I1 through the second reference impedor Zref2 and a second current I2 through the impedance component Zid. Then, the equivalent impedance of the impedance components Zid is calculated accordingly. In the embodiment, the reference power source Ps is a voltage source or a current source. In an embodiment, the voltage value of the second reference voltage Vref2 is equal to that of the first reference voltage Vref. In another embodiment, the voltage value of the second reference voltage Vref2 is different from that of the first reference voltage Vref.

As shown in FIG. 4, in an embodiment, the second reference impedor Zref2 is configured in the power control unit 110. In an embodiment, the second reference impedor Zref2 is configured out of the power control unit 110 and connected to the power control unit 110.

Figure 5:
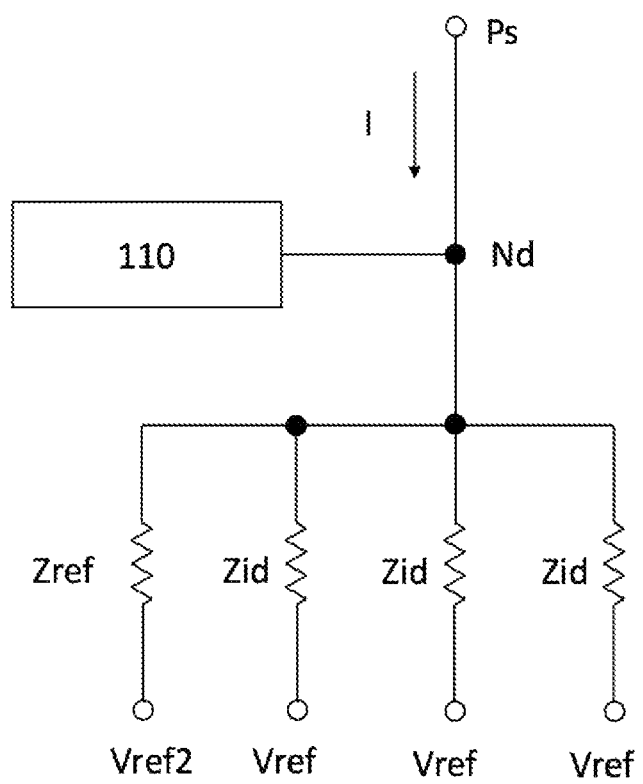
FIG. 5 is an equivalent circuit diagram of a detecting circuit according to a first embodiment.

FIG. 5 is an equivalent circuit diagram of a detecting line according to a first embodiment. In FIG. 3, the end of the first reference impedor Zref away from the node Nd is connected to the power source Ps. In comparison, in FIG. 5, the end of the first reference impedor Zref away from the node Nd is connected to the second reference voltage Vref2, and the node Nd is connected to the power source Ps. In the embodiment, the power source Ps is a current source to provide the current I. The power control unit 110 detects the voltage of the node that connected to the first reference impedor Zref and the impedance components Zid. Then, the equivalent impedance of the impedance components Zid is calculated. The voltage value of the second reference voltage Vref2 is equal to or different from that of the first reference voltage Vref in different embodiments.

Figure 6:
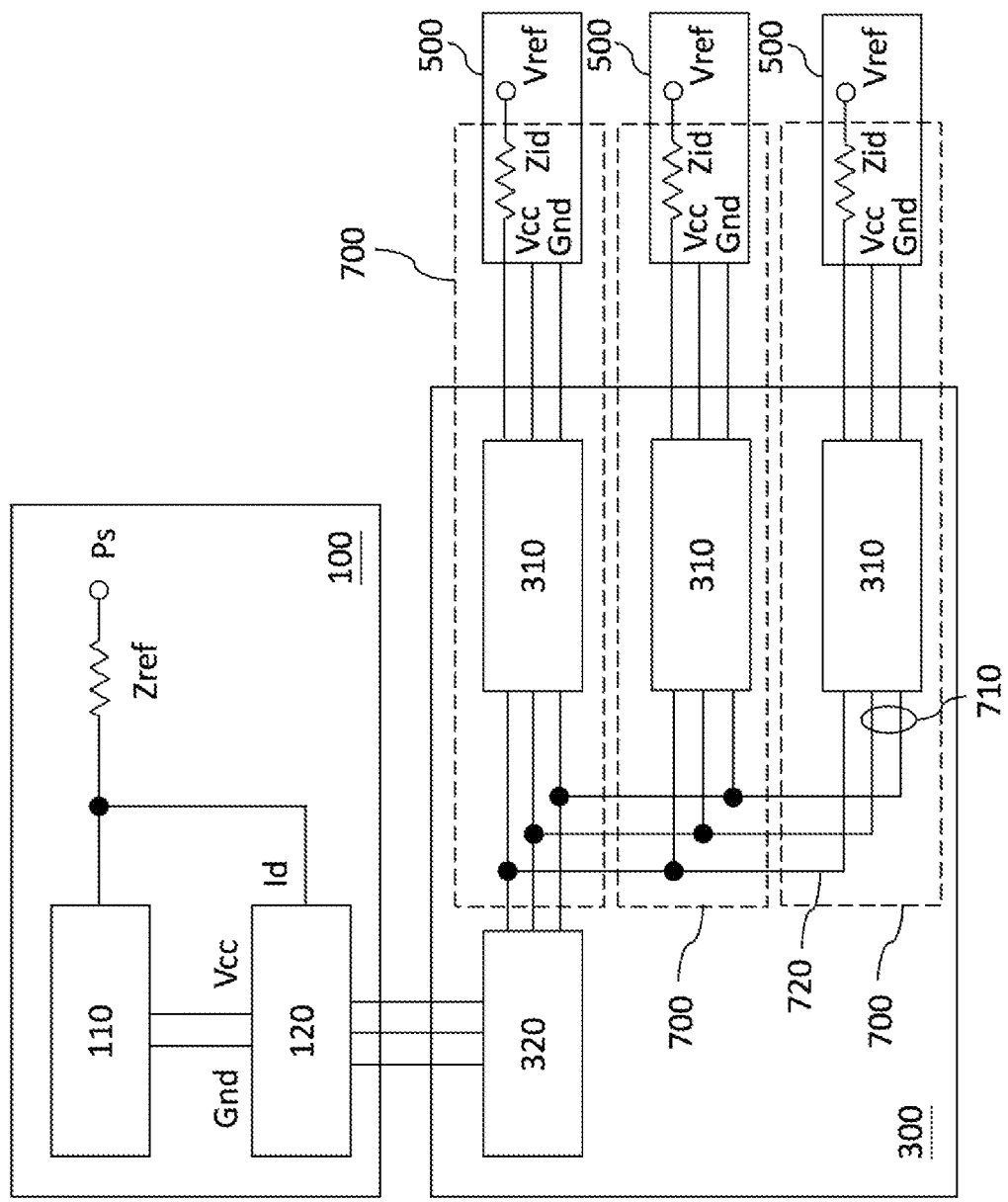
FIG. 6 is a block diagram of a multiport connector according to a second embodiment.

FIG. 6 is a block diagram of a multiport connector 300 according to an embodiment. The difference between the power control device in this embodiment and that of the first embodiment is that each impedance components Zid is configured in the power adapter 500 correspondingly. When the power input port 310 of the multiport connector 300 is connected to the power adapter 500, the impedance component Zid is connected to the detecting circuit 720 in series. One end of the impedance component Zid that away from the power input port 310 is connected to the first reference voltage Vref. Therefore, only the impedance component Zid in the power adapter 500 connected to the multiport connector 300 appears in the equivalent circuit shown in FIG. 3 or FIG. 4. Then, the power control unit 110 calculates the equivalent impedance of the impedance components Zid according to the detected voltage value or current value to determine the number of the power adapters 500 connected to the multiport connector 300.

In an embodiment, the impedance value of the impedance component Zid in each power transmission path 700 is different. Then, the power control unit 110 determines the power of the power adapter 500 connected to the power transmission path 700 (impedance values correspond to different power). Therefore, the upper limit of load power can be adjusted more accurately.

Figure 7:
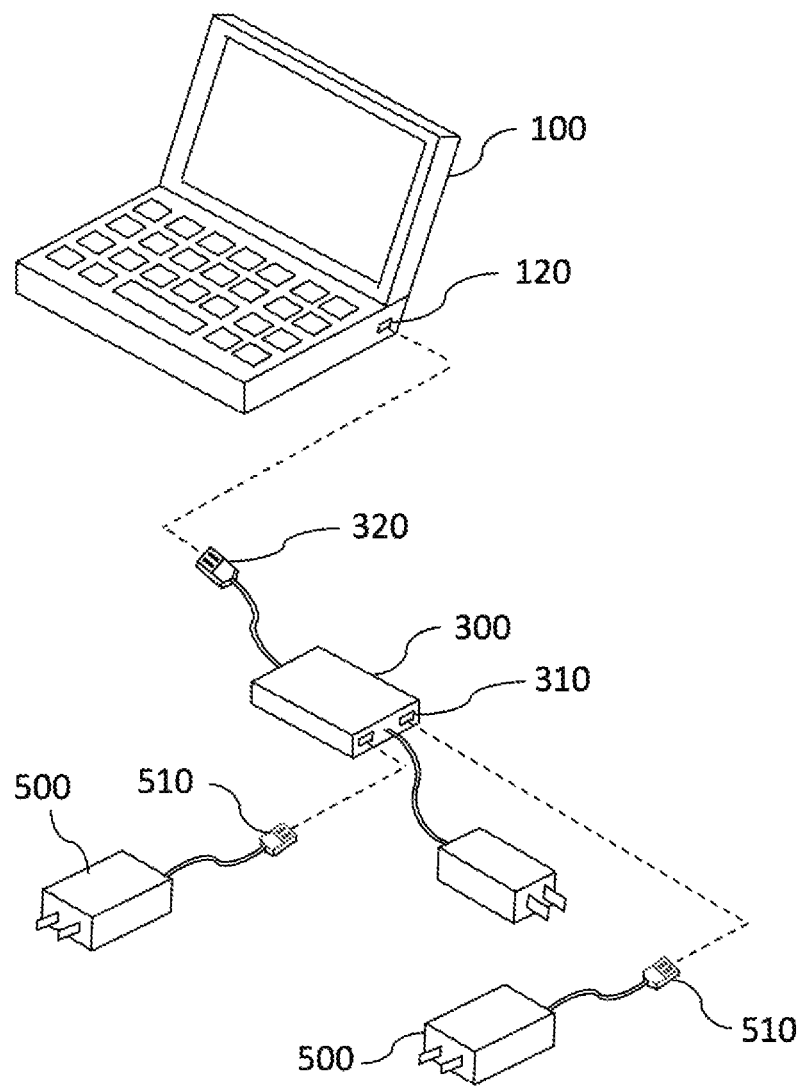
FIG. 7 is a schematic diagram of a multiport connector according to a third embodiment.
Figure 8:
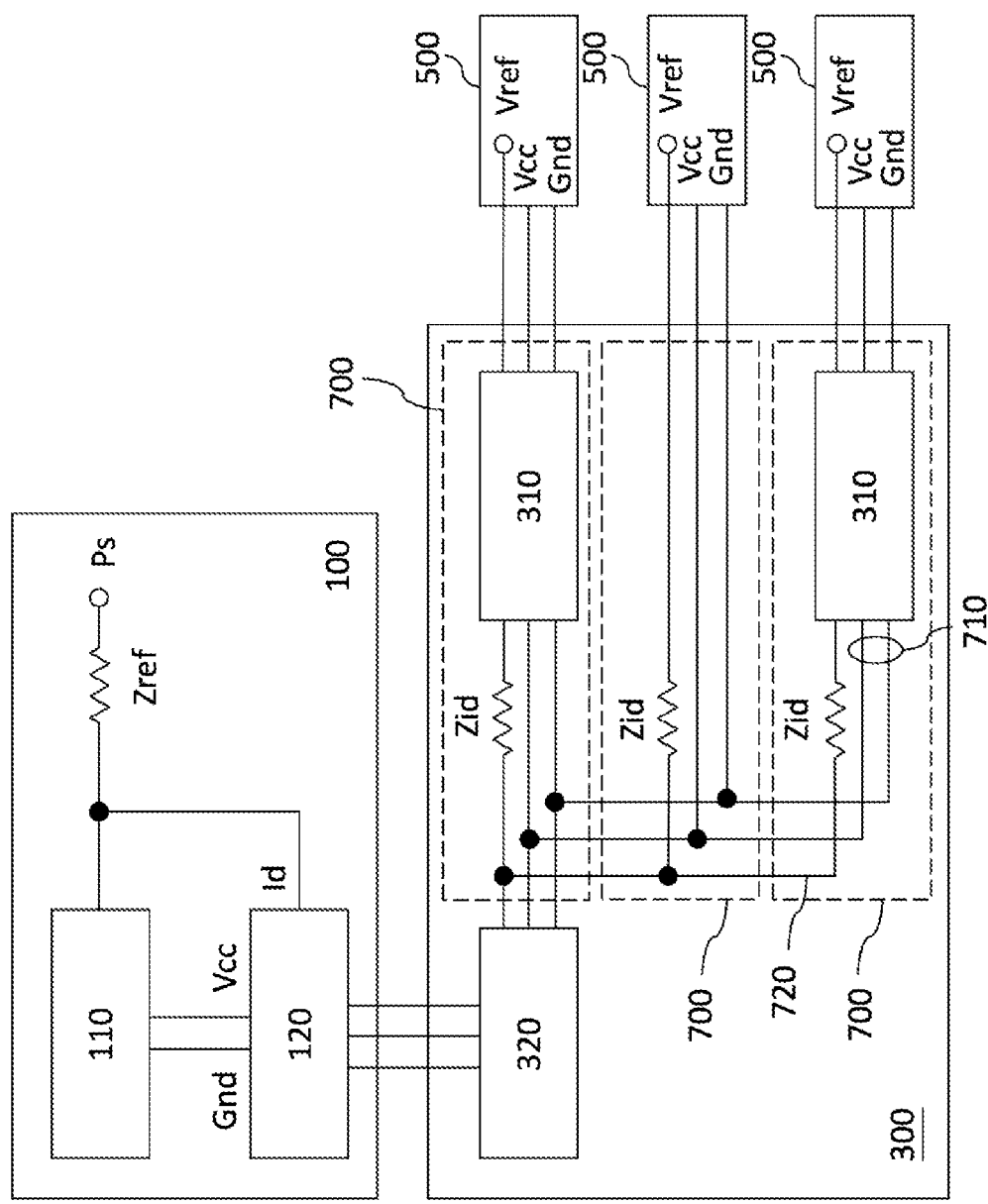
FIG. 8 is a block diagram of a multiport connector according to a third embodiment.

FIG. 7 is a schematic diagram of a multiport connector according to a third embodiment. FIG. 8 is a block diagram of a multiport connector according to a third embodiment. In comparison with the first embodiment, the multiport connector 300 in the third embodiment is integrated with one of the power adapters 500. In other words, the power input port 310 can be omitted, and the power line 710 and the detecting circuit 720 are directly connected to the power adapter 500. Similarly, in an embodiment, one of the power input ports 500 in the power control device in the second embodiment can also be omitted, and the multiport connector 300 is integrated with the power adapter 500.

Figure 9:
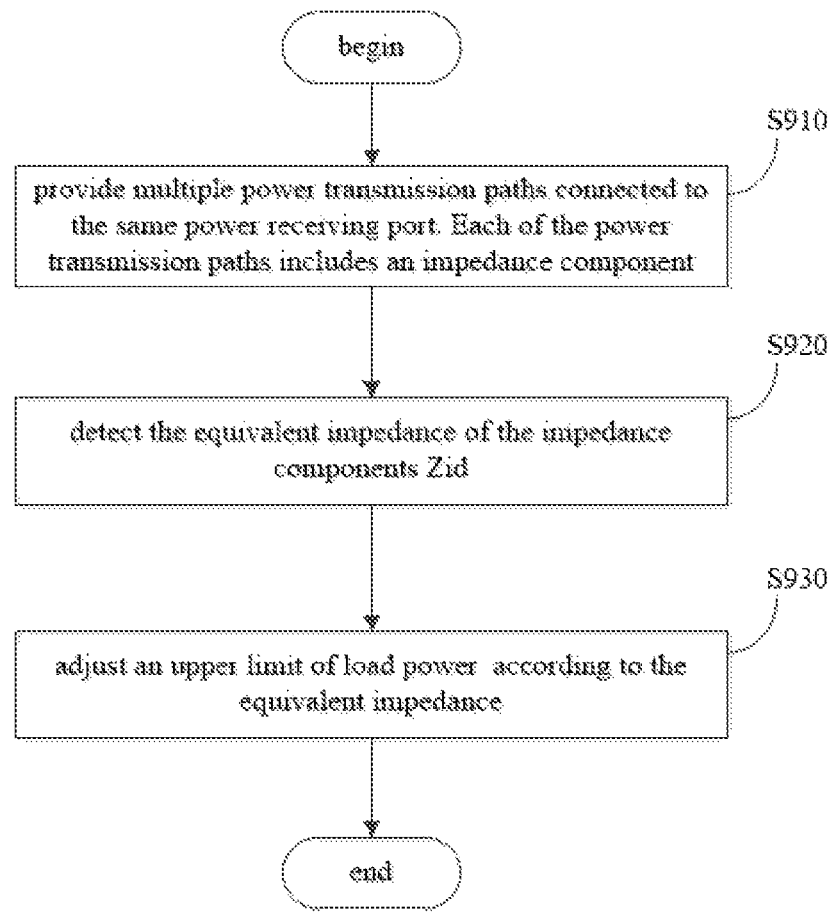
FIG. 9 is a flow chart of a power control method according to a first embodiment.

FIG. 9 is a flow chart of a power control method according to a first embodiment. First, multiple power transmission paths connected to the same power receiving port 310 are provided (step S910). Each of the power transmission paths includes an impedance component. The equivalent impedance of the impedance components Zid is detected (step S920). Then, an upper limit of load power is adjusted according to the equivalent impedance (step S930).

In an embodiment, the equivalent impedance corresponds to the number of the power adapters 500 connected to the power transmission paths 700. Therefore, in step S930, the upper limit of load power is adjusted according to the number of the power adapters 500. The larger the number of the connected power adapters 500 is, the larger the upper limit of load power is.

In an embodiment, the equivalent impedance corresponds to the power of the power adapters 500 connected to the power transmission paths 700. Therefore, in step S930, the upper limit of load power is adjusted according to the total power of the connected power adapters 500. The larger the total power is, the larger the upper limit of the adjusted load power is.

In sum, the number of the power adapters connected to an electronic device is detected to adjust the upper limit of load power of the electronic device in embodiments. Then, the number of power adapters are varied to meet the requirement on the efficiency of electronic device.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A multiport connector, configured to be connected to multiple power adapters, the multiport connector comprising:
    a power output port, configured to be connected to an electronic device; and
    multiple power input ports configured to be connected to the power adapters to form multiple power transmission path, each of the power transmission paths includes a power line, a detecting circuit, and an impedance component connected to the detecting circuit in series;
    wherein an impedance component is connected between each of the power input ports and each of the power output ports, and when the power input port is connected to the power adapter, an impedance component corresponding to the power input port is connected to a first reference voltage of the power adapter.

2. The multiport connector according to claim 1, wherein the first reference voltage is equal to a ground level of the power line.

3. The multiport connector according to claim 1, wherein each of the impedance components is configured in each of the power adapters correspondingly.

4. The multiport connector according to claim 3, wherein one end of each of the impedance components that away from the power input port is connected to a first reference voltage.

5. The multiport connector according to claim 4, wherein the first reference voltage is equal to a ground level of the power line.

6. The multiport connector according to claim 1, wherein the multiport connector is integrated with one of the multiple power adapters.

7. The multiport connector according to claim 1, wherein the electronic device comprises a power control unit, a power receiving port and a first reference impedor, the first reference impedor is connected to the power receiving port, and the power control unit is connected to a node between the first reference impedor and the power receiving port, when the multiport connector is connected to the power receiving port, the first reference impedor is connected to the impedance components.

8. The multiport connector according to claim 7, wherein an end of the first reference impedor away from the node is connected to a reference power source.

9. The multiport connector according to claim 7, wherein the node is connected to a reference power source.

10. The multiport connector according to claim 7, wherein the electronic device further comprises a second reference impedor, one end of the second reference impedor is connected to the node, and another end of the second reference impedor is connected to a second reference voltage.

11. A power control method, comprising:
    providing an electronic device comprising a power control unit, a power receiving port and a first reference impedor, the first reference impedor is connected to the power receiving port, and the power control unit is connected to a node between the first reference impedor and the power receiving port;
    providing multiple power transmission paths connected to the power receiving port, each of the power transmission paths includes an impedance component so that the first reference impedor is connected to the impedance components;

detecting, by the power control unit, equivalent impedance of the impedance components based on the first reference impedor; and adjusting an upper limit of load power according to the equivalent impedance.

12. The power control method according to claim 11, wherein the equivalent impedance corresponds to the number of at least one power adapter connected to the power transmission paths, and the step of adjusting the upper limit of load power according to the equivalent impedance further includes a step of adjusting an upper limit of load power according to the number of the power adapter.

13. The power control method according to claim 11, wherein the equivalent impedance corresponds to power of a power adapter connected to the power transmission paths, and the step of adjusting the upper limit of load power according to the equivalent impedance further includes a step of adjusting an upper limit of load power according to total power of the connected power adapter.

* * * * *